(12) United States Patent
Kutz et al.

(10) Patent No.: US 7,586,795 B2
(45) Date of Patent: Sep. 8, 2009

(54) VARIABLE REFERENCE VOLTAGE CIRCUIT FOR NON-VOLATILE MEMORY

(75) Inventors: Harold Kutz, Snoqualmie, WA (US); Mark Rouse, Snohomish, WA (US); Eric D. Blom, Lynnwood, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 297 days.

(21) Appl. No.: 11/385,235

(22) Filed: Mar. 20, 2006

(65) Prior Publication Data

US 2007/0217271 A1    Sep. 20, 2007

(51) Int. Cl.
*G11C 5/14* (2006.01)
(52) U.S. Cl. .......................... 365/189.09; 365/189.011; 365/189.02; 365/185.2; 365/185.24; 365/185.03
(58) Field of Classification Search ............ 365/189.09, 365/189.011, 189.02, 185.02, 185.2, 185.24, 365/185.03
See application file for complete search history.

(56) References Cited

U.S. PATENT DOCUMENTS

| | | | |
|---|---|---|---|
| 5,307,315 A * | 4/1994 | Oowaki et al. ......... | 365/189.09 |
| 5,596,532 A * | 1/1997 | Cernea et al. .......... | 365/185.18 |
| 6,191,977 B1 * | 2/2001 | Lee ........................ | 365/185.21 |
| 6,525,961 B2 * | 2/2003 | Rolandi et al. ......... | 365/185.03 |
| 6,529,422 B1 * | 3/2003 | Mazumder et al. ..... | 365/189.09 |
| 6,829,194 B2 * | 12/2004 | Honda et al. ................. | 365/226 |
| 2006/0291322 A1 * | 12/2006 | Crippa et al. .......... | 365/230.06 |

OTHER PUBLICATIONS

She, M. et al., "Improved SONOS-type Flash Memory Using HfO₂ as Trapping Layer," 19th Non-Volatile Semiconductor Memory Workshop, pp. 53-55 (2003). Retrieved from: http://www.eecs.berkeley.edu/~takeuchi/paper/HfO2_memory.pdf.

* cited by examiner

*Primary Examiner*—Pho M. Luu
*Assistant Examiner*—Eric Wendler

(57) ABSTRACT

A variable reference voltage circuit for performing memory operation on non-volatile memory includes a multi-level voltage source and a selector circuit. The multi-level voltage source generates multiple voltages. The selector circuit includes a selector input and a selector output. The selector input is coupled to the multi-level voltage source to selectively couple any of the multiple voltages to the selector output. The selector output of the selector circuit is coupled to a non-volatile memory array to provide the NV memory array with a selectable program voltage for programming the NV memory array and a selectable erase voltage for erasing the NV memory array.

14 Claims, 5 Drawing Sheets

VARIABLE REFERENCE VOLTAGE CIRCUIT FOR NON-VOLATILE MEMORY

TECHNICAL FIELD

This disclosure relates generally to electronic circuits, and in particular but not exclusively, relates to control circuits for non-volatile memories.

BACKGROUND INFORMATION

Electrically erasable programmable read only memory ("EEPROM") is a type of rewritable non-volatile ("NV") memory chip that holds its content without power. EEPROMs have lifespans, measured in number of write cycles, considerably greater than electrical programmable read only memories ("EPROMs"), the technology that preceded EEPROMs.

EEPROMS use a floating gate to hold a charge. Based on whether charge is trapped on the floating gate, the EEPROM transistor acts like a permanently-open or closed transistor. Charging the floating gate is accomplished by grounding source and drain terminals of the EEPROM transistor and placing a voltage on a control gate (write terminal). Applying a reverse voltage to the control gate causes the charge to dissipate into the substrate.

SONOS (poly-Silicon-Nitride-Oxide-Silicon) is a type of non-volatile ("NV") memory that has attracted much attention due to its advantages over traditional floating-gate flash. Some of these advantages include lower programming voltages, better scalability, and improved cycling endurance. However, SONOS memory still suffers from endurance and retention degradation over its lifespan due to operational stresses. These operational stresses arise from the programming and erasing voltages applied to the control gate and from elevated operating temperatures. Eventually operational stresses lead to trapped charge accumulation on the floating gate of the EEPROM, resulting in the inability of an EEPROM memory cell to retain data.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of an apparatus for and a method of operation of a variable reference voltage circuit for performing memory operations on a non-volatile memory array are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
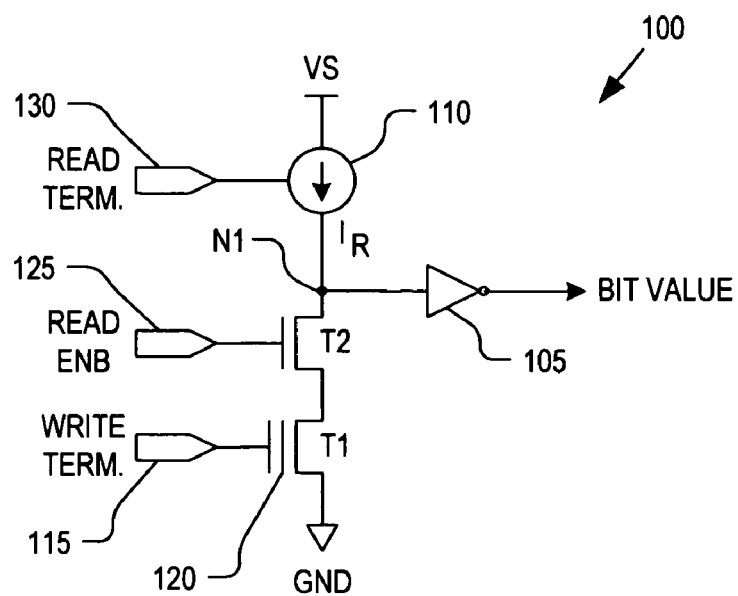
FIG. 1 is a circuit diagram illustrating a nonvolatile memory cell.

FIG. 1 is a circuit diagram illustrating a nonvolatile ("NV") memory cell 100 for storing a bit value of data. Hundreds, thousands, or even millions of NV memory cells 100 may be grouped together to form an NV memory array (e.g., flash memory, EEPROM, etc.). In one embodiment, NV memory cell 100 represents a single memory cell of a poly-silicon-oxide-nitride-oxide-silicon ("SONOS") flash memory array. FIG. 1 is not intended to be a complete detailed schematic of an NV memory cell, but rather one of ordinary skill in the art having the benefit of the instant disclosure will appreciate only relevant components for the purposes of this discussion are illustrated.

The illustrated embodiment of NV memory cell 100 includes transistors T1 and T2, an inverter buffer 105, and a current source 110. In one embodiment, transistor T1 is an EEPROM transistor including a control gate coupled to a write terminal 115 and a floating gate 120. By appropriate application of write voltages to write terminal 115, charge can be made to accumulate onto floating gate 120 or dissipate from floating gate 120, thereby writing data to NV memory cell 100. Since power is not required for NV memory cell 100 to retain its data on floating data 120, NV memory cell 100 is referred to as "non-volatile."

A write operation on NV memory cell 100 may include either "programming" or "erasing." As mere arbitrary convention for the purpose of this discussion, a programming operation writes a logical '1' bit value into NV memory cell 100 by application of a positive voltage onto write terminal 115. An erase operation writes a logical '0' bit value into NV memory cell 100 by application of a negative voltage onto write terminal 115.

NV memory cell 100 can be read by asserting a read enable terminal 125 of transistor T2 to close circuit transistor T2 and by applying a read voltage VR to read terminal 130 of current source 110. Read voltage VR is converted to a read current $I_R$ by current source 100 (e.g., 5 µA). Depending upon the write state of transistor T1, node N1 either will be pulled up towards the supply voltage (VS) rail or pulled down towards the ground voltage (GND) rail.

In the embodiment where NV memory array 100 represents SONOS flash memory, programming places transistor T1 in a near zero current state (e.g., 1 pA), thereby resembling an open circuit. In the programmed state, node N1 is pulled up to VS and inverting buffer 105 outputs a '0' bit value. Erasing places transistor T1 in a current draw state (e.g., 30 µA), thereby resembling a current source that overwhelms current source 110. In the erased state, node N1 is pulled down to GND and inverting buffer 105 outputs a '1' bit value.

Conventional techniques use a write voltage with a single absolute magnitude (e.g., either positive or negative) applied to write terminal 115 for both erase and program operations. Furthermore, conventional techniques apply the same magnitude write voltage to read terminal 130 for generating read current $I_R$. However, each memory operation (program, erase, and read) has its own optimal voltage for maximizing endurance and retention of NV memory cell 100, balanced against minimizing operation time. These optimal voltages need not be the same. In fact, these optimal voltages are typically not the same and therefore conventional techniques attempt to select a single write voltage magnitude that achieves a reasonable compromise between the optimal voltages for erasing and programming. Embodiments of the instant invention include a variable reference voltage circuit capable of applying a different voltage to write terminal 115 and read terminal 130 dependent upon the memory operation being performed. Since the write voltages for each memory operation are decoupled, compromise is no longer necessary and designers are free to select a read voltage VR, a program voltage VP, and an erase voltage VE specifically tailored for the intended memory operation.

Figure 2:
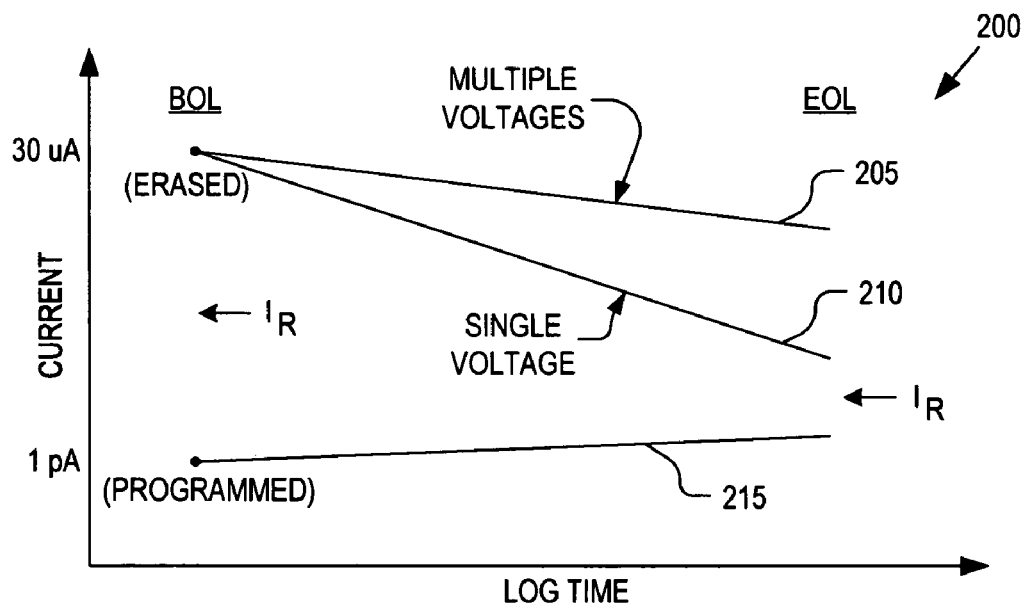
FIG. 2 is a line graph illustrating aging effects on a non-volatile memory cell, in accordance with an embodiment of the invention.

FIG. 2 is a line graph 200 illustrating aging effects on NV memory cell 100 due to non-optimal selection of write voltages, in accordance with an embodiment of the invention. FIG. 2 is merely provided for illustrative purposes and is not drawn to scale based on actual data. As illustrated, at the beginning of life ("BOL"), NV memory cell 100 has a distinct differentiation between erase state currents (lines 205 and 210) and the program state current (line 215). However, as NV memory cell 100 ages (measured in number of write cycles), line 215 slowly drifts up and lines 205 and 210 drift down, resulting in reduced differentiation between the erase and program state currents. Eventually, differentiation between the erase and program states will become indistinguishable resulting in eventual failure at the end of life ("EOL").

However, in the case where a single compromise voltage is used for both erase and program operations, the degree of downward drift is more dramatic than in the case where the program voltage VP and erase voltage VE are independently selected. Use of multiple independent voltage levels for erase and program operations can increase the endurance (life span) and retention of NV memory cell 100.

Figure 3:
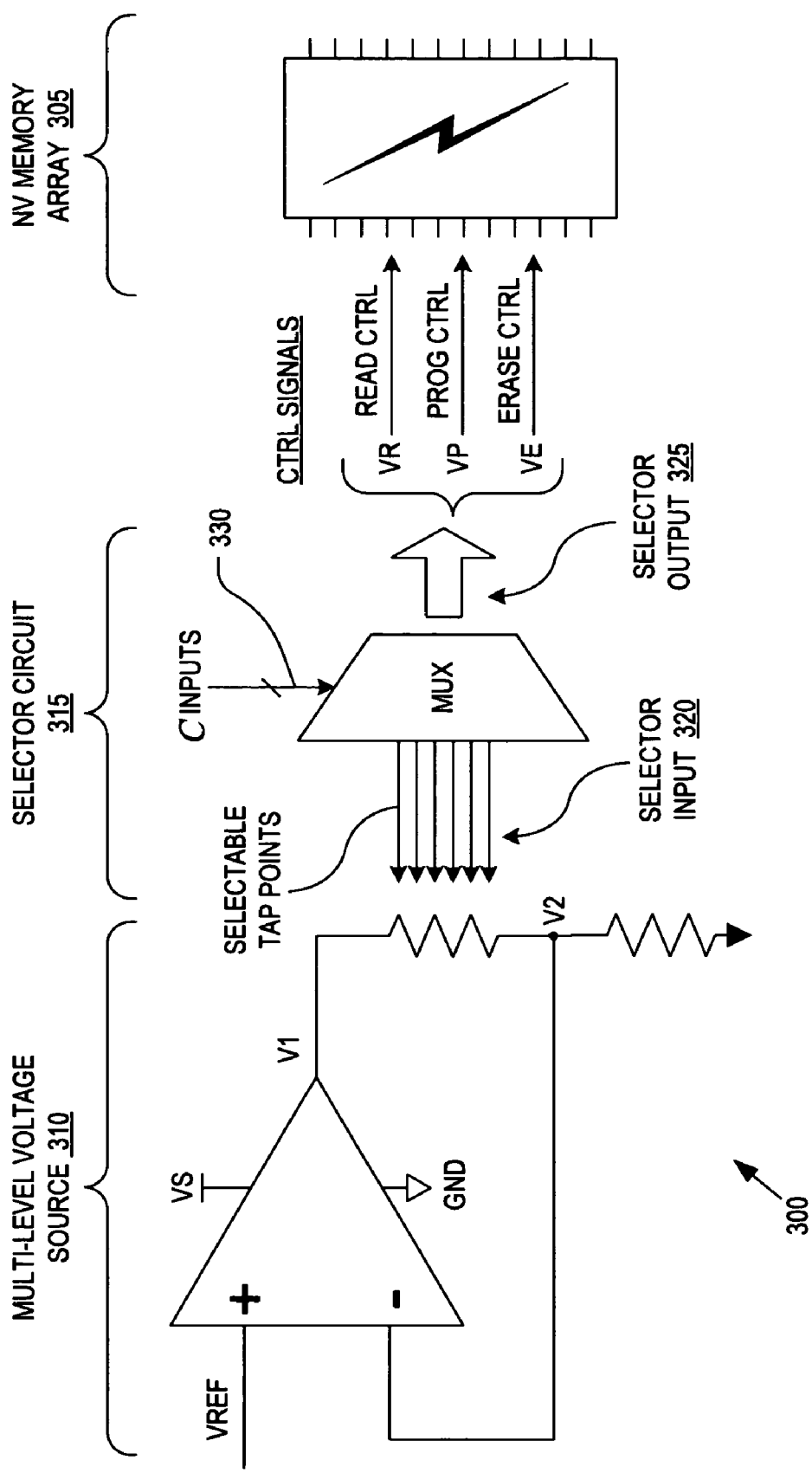
FIG. 3 is a functional block diagram illustrating a variable reference voltage circuit for controlling read and write operations on a non-volatile memory array, in accordance with an embodiment of the invention.

FIG. 3 is a functional block diagram illustrating a variable reference voltage circuit 300 for controlling read and write operations on an NV memory array 305, in accordance with an embodiment of the invention. The illustrated embodiment of variable reference voltage circuit 300 includes a multi-level voltage source 310 and a selector circuit 315. In one embodiment, NV memory array 305 is a SONOS memory array including a plurality of individual NV memory cells 100 coupled for storing data.

Multi-level voltage source 310 generates multiple control voltages which may each be independently selected and forwarded to NV memory array 305 by selector circuit 315 during memory operations (e.g., read, program, and erase). In one embodiment, multi-level voltage source 310 generates the multiple control voltages based on a stable reference voltage VREF, amplifies the stable VREF and then divides the amplified VREF into the multiple different control voltages. It should be appreciated that a variety of techniques not illustrated may be used to implement multi-level voltage source 310 to generate the multiple control voltages.

Selector circuit 315 is coupled to multi-level voltage source 310, to selectively tap off the different multiple control voltages and forward selected ones of the multiple control voltages to NV memory array 305 dependent upon the type of memory operation being performed. In one embodiment, selector circuit 315 selects a specific voltage from multi-level voltage source 310 under control of a controller (e.g., microcontroller, state machine, etc.). For example, selector circuit 315 may include a multiplexer ("MUX") having a selector input 320, a selector output 325, and a multi-bit MUX select input 330. The selector input 320 may be coupled to receive each of the different control voltages from multi-level voltage source 310 and selectively forwards them to selector output 325 under control of MUX select input 330.

The forwarded control signals output from selector output 325 may then be used on NV memory array 305 to perform each of the memory operations. During the read operation, a read control signal having a read voltage VR is forwarded to NV memory array 305 by selector circuit 315. During the program operation, a program control signal having a program voltage VP is forwarded to NV memory array 305 by selector circuit 315. During the erase operation, an erase control signal having an erase voltage VE is forwarded to NV memory array 305 by selector circuit 315. Each voltage VR, VP, and VE can be selected to optimize the particular memory operation for speed, retention, and/or endurance, as well as other factors.

The voltages VR, VP, and VE may be determined on a part-by-part basis or on a batch basis after a chip including variable reference voltage circuit 300 has been fabricated. After each chip is fabricated, it may be tested to determine the optimal or near optimal voltages VR, VP, and VE for each memory operation. Alternative, voltages VR, VP, VE may be determined on an architectural basis prior to fabrication if the intended type of NV memory array 305 to be used with variable reference voltage circuit 300 is known. Since the voltages VR, VP, and VE can be selected under control of a programmable controller (e.g., microcontroller, state machine, etc.), these voltages can be adjusted in real-time based on the operating temperature of NV memory array 305 and based on the age of NV memory array 305. As illustrated above in FIG. 2, the optimal read current $I_R$ may change over the lifespan of NV memory array 300. Accordingly, the controller may be programmed to account for aging and selected differing read voltages VR based on the number of write cycles performed on a given NV memory array 305. In this embodiment, variable reference voltage circuit 300 or the controller may maintain a write cycle counter or other types of aging counters.

The desired factors for which voltages VR, VP, and VE are optimized may also be selected. For example, voltages VR, VP, and VE can be optimized to increase endurance and/or retention of NV memory array 305, at the expense of operation speed. Voltages VR, VP, and VE may be optimized to increase operation speed at the expense of endurance and/or retention. Or, voltages VR, VP, and VE may each be independently selected for optimal compromises between operation speed, retention, and endurance.

Figure 4:
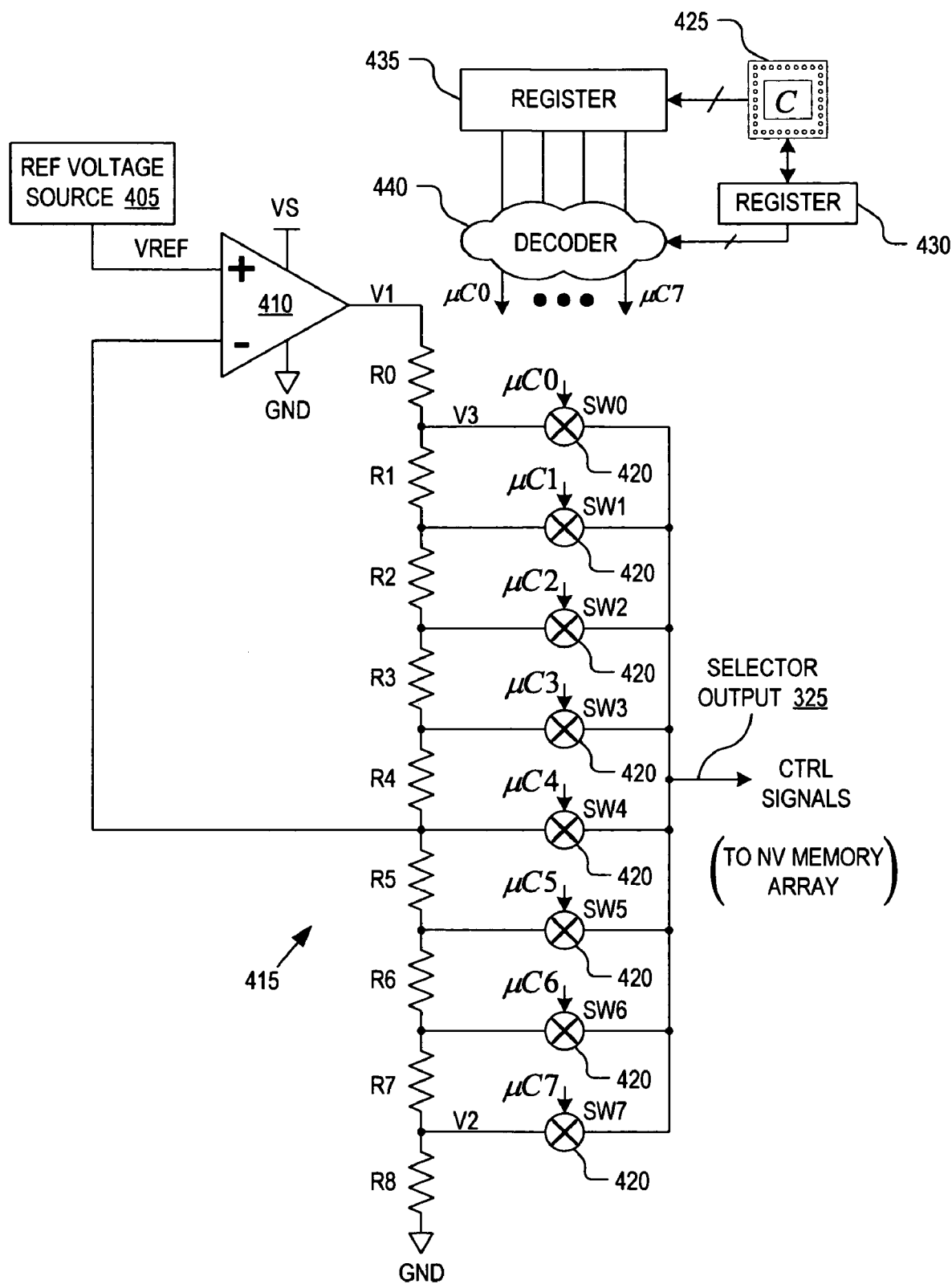
FIG. 4 is a circuit diagram illustrating a variable reference voltage circuit for controlling read and write operations on a non-volatile memory array, in accordance with an embodiment of the invention.

FIG. 4 is a circuit diagram illustrating one embodiment of variable reference voltage circuit 300 in greater detail. In the illustrated embodiment, multi-level voltage source 310 is represented by a reference voltage source 405, an operational amplifier 410, and a voltage divider 415. In the illustrated embodiment, selector circuit 315 is represented by a plurality of switches SW0-SW7 (collectively switches 420) coupled between intermediate nodes along voltage divider 415 and selector output 325. FIG. 4 further illustrates control logic for controlling switches 420. The illustrated embodiment of the control logic includes a controller 425, registers 430 and 435, and decoder logic 440. In various embodiments, controller 425 may be implemented as a microcontroller, a state machine, or the like.

Reference voltage source 405 may be implemented by a variety of techniques for generating a known stable voltage. For example, reference source 405 may represent a band gap voltage reference generating a reference voltage VREF approximately equal to 1.3V. Operational amplifier 410 is configured in a follower with gain configuration and outputs a reference voltage V1 (e.g., 1.8V) based on VREF and a feedback gain factor of the gain follower configuration.

Voltage divider 415 includes a plurality of resistors R0-R8 coupled in series. Resistor R0 is coupled to the output of operational amplifier 410 to receive reference voltage V1. Resistor R8 is coupled to the GND voltage rail or to any potential lower or higher than the output of operational amplifier 410. In one embodiment, resistors R0-R8 are polysilicon resistors. Although FIG. 4 illustrates nine series coupled resistors, it should be appreciated that embodiments of the invention may include more or less resistors dependent, in part, upon the voltage resolution desired for the control signals. In one embodiment where NV memory array 305 is a SONOS memory array, voltages V2 and V3 generated by voltage divider 415 range between V2=1.2V and V3=1.8V. However, other voltage ranges are possible. It should be appreciated that voltage divider 415 illustrated in FIG. 4 is only one of many possible circuits and techniques for implementing voltage division in connection with embodiments of the invention.

The illustrated embodiment of selector circuit 315 includes eight switches SW0-SW7; however, selector circuit 315 may include more or less switches 420 dependent, in part, on the voltage resolution or increment size desired. Switches 420 are coupled to the intermediate nodes between resistors R0-R8 to selectively forward any of the voltages between V2 and V3 to selector output 325. Switches 420 include control terminals μC0-μC7 for controlling conductivity of switches 420. Control terminals μC0-μC7 are coupled to the output of decoder logic 440.

During operation, controller 425 writes a multi-bit value into register 435 indicating the type of memory operation to be performed on NV memory array 305. In response, decoder logic 440 decodes the multi-bit value to selectively close one of switches 420 (i.e., place in a conducting state) and open circuit the rest of switches 420. In this manner, controller 425 is capable of selecting a different voltage dependent upon the memory operation being performed based on the multi-bit value written into register 435.

In one embodiment, decoder 440 determines what voltage to select for a given memory operation based on operation values stored in register 430. Register 430 may store three values: a program value indicating the program voltage VP to be applied to NV memory array 305 during a program operation, an erase value indicating the erase voltage VE to be applied to NV memory array 305 during an erase operation, and a read value indicating the read voltage VR to be applied to NV memory array 305 during a read operation. As discussed above these values may be determined on a part-by-part basis and programmed into register 430 after fabrication. In one embodiment, controller 425 may update the values stored in register 430 under user control.

Accordingly, in one embodiment, the multi-bit value written into register 435 by controller 425 selects the type of memory operation to perform and decoder 440 uses the multi-bit value written in register 435 to access the appropriate value corresponding to the memory operation stored in register 430. Subsequently, decoder 440 enables/disables the appropriate switches 420 to achieve the desired voltage indicated by the value stored in register 430 for the memory operation indicated in register 435. In an alternative embodiment, controller 425 may access register 430 to determine what voltage to select for a given memory operation and then write a multi-bit value into register 435 that indicates to decoder 440 both the type of memory operation to perform and the specific voltage to apply. In this alternative embodiment, decoder 440 need not be coupled to register 430.

In one embodiment, register 430 stores a plurality of program values each indicating a different program voltage VP to be applied at a given operating temperature range. Alternatively, register 430 may store temperature scaling factors to be applied to the single program value based on the current operating temperature. Register 430 may also store a plurality of program values or aging scaling factors that may be used to adjust the program voltage VP based on the age of NV memory array 305. Similarly, multiple erase values or temperature/aging scaling factors may be stored to adjust the erase voltage VE based on operating temperature and/or age. Similarly, multiple read values or temperature/aging scaling factors may be stored to adjust the read voltage VR based on operating temperature and/or age.

Figure 5:
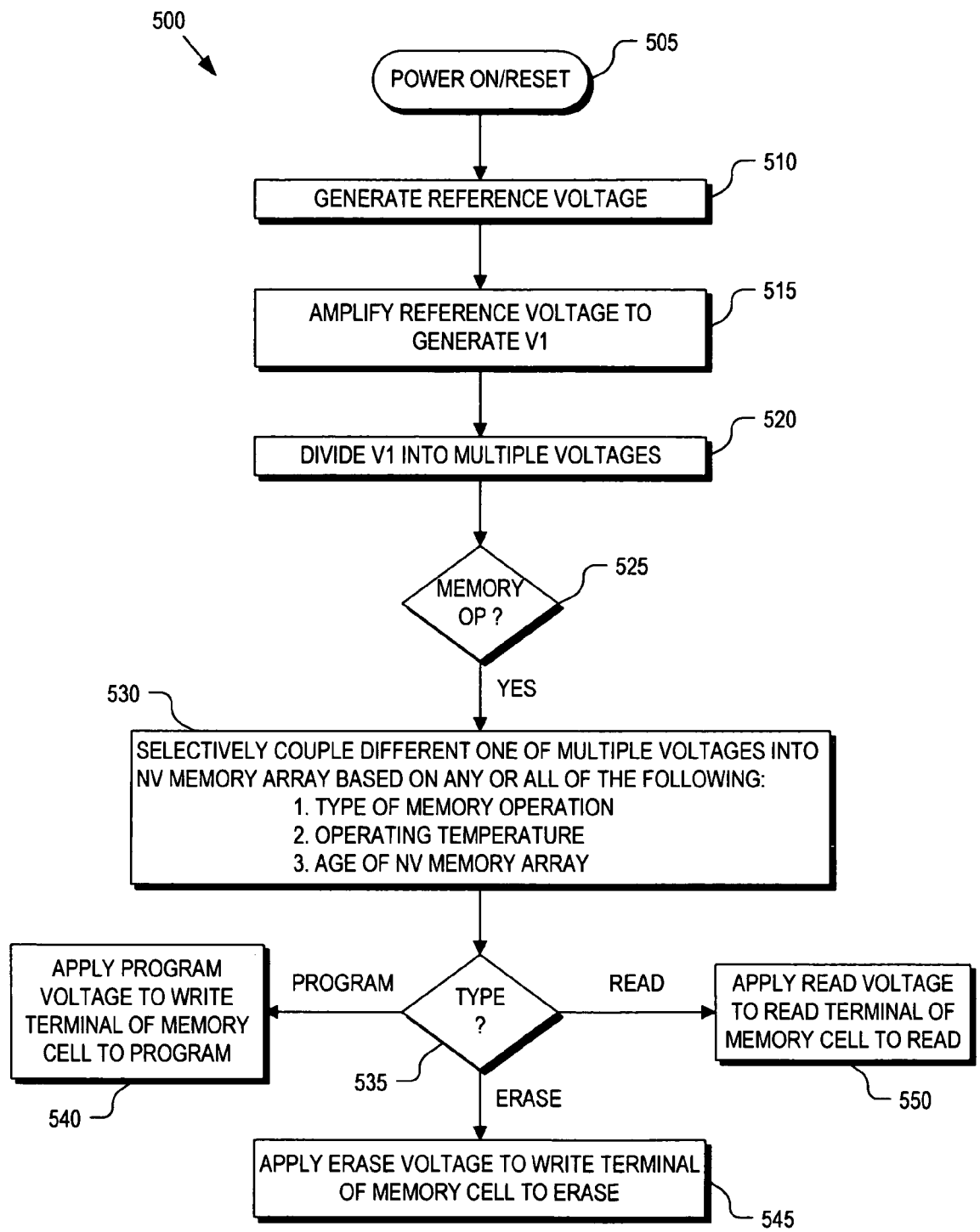
FIG. 5 is a flow chart illustrating operation of a variable reference voltage circuit for a non-volatile memory array, in accordance with an embodiment of the invention.

FIG. 5 is a flow chart illustrating a process 500 for operating variable reference voltage circuit 300, in accordance with an embodiment of the invention. The order in which some or all of the process blocks appear in each process should not be deemed limiting. Rather, one of ordinary skill in the art having the benefit of the present disclosure will understand that some of the process blocks may be executed in a variety of orders not illustrated.

In a process block 505, variable reference voltage circuit 300 is powered on and/or reset. Once powered on, reference voltage source 405 generates reference voltage VREF (process block 510), operational amplifier 410 amplifies reference voltage VREF to reference voltage V1 (process block 515), and voltage divider 415 divides reference voltage V1 into multiple voltages ranging between V3 and V2 (process block 520).

When a request to perform a memory operation on NV memory array 305 is received (decision block 525), controller 425 writes the appropriate multi-bit value into register 435 corresponding to the requested memory operation type (read, program, or erase). Decoder logic 440 decodes the multi-bit value buffered in register 435 with reference to register 430 to selectively couple the appropriate control voltage (e.g., VR, VP, or VE) from multi-level voltage source 310 into NV memory array 305 (process block 530).

If the requested memory operation is a program operation (decision block 535), then selector circuit 315 provides the program voltage VP to NV memory array 305 for application to write terminal 115 of transistor T1 (see FIG. 1) of an appropriate NV memory cell 100 within NV memory array 305 (process block 540). If the requested memory operation is an erase operation (decision block 535), then selector circuit 315 provides the erase voltage VE to NV memory array 305 for application to write terminal 115 of transistor T1 (see FIG. 1) of an appropriate NV memory cell 100 within NV memory array 305 (process block 545). If the requested memory operation is a read operation (decision block 535), then selector circuit 315 provides the read voltage VR to NV memory array 305 for application to read terminal 130 of transistor T2 (see FIG. 1) of an appropriate NV memory cell 100 within NV memory array 305 (process block 540).

Figure 6:
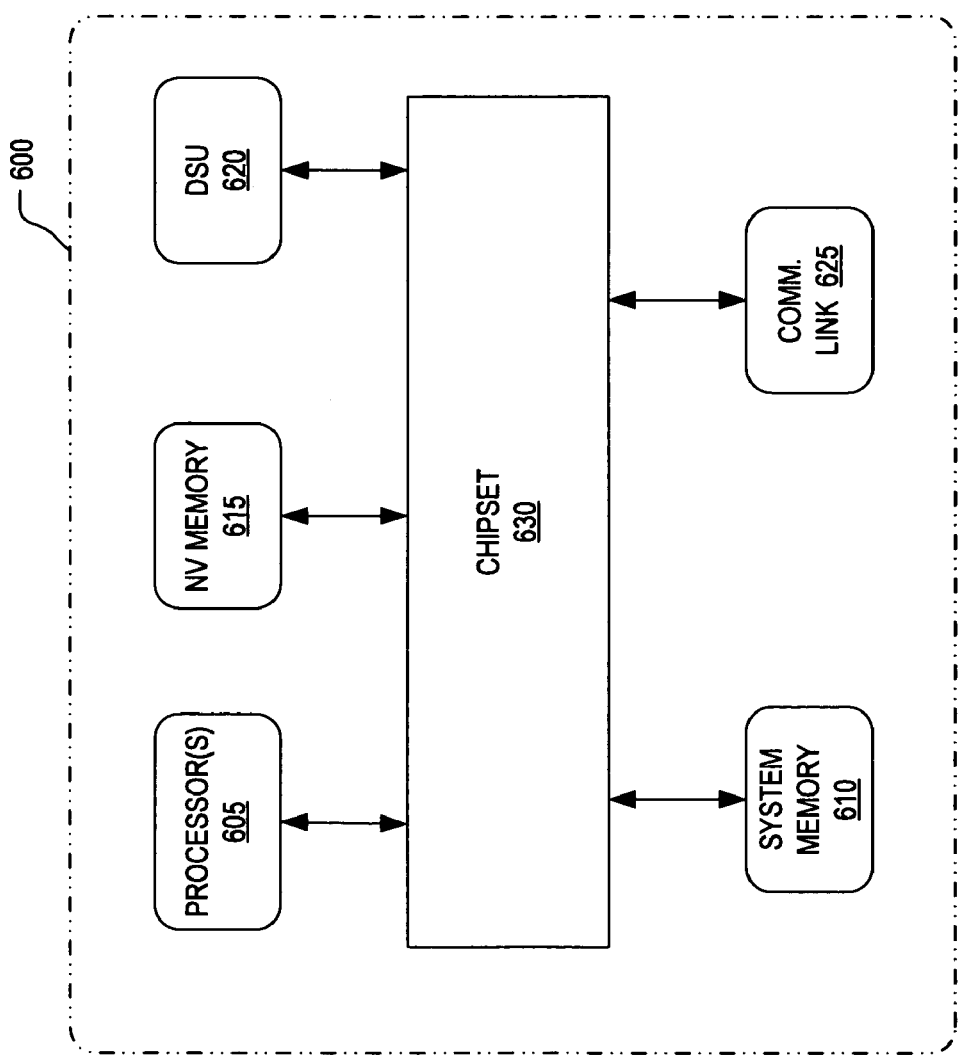
FIG. 6 illustrates a demonstrative processing system implemented with an embodiment of the invention.

FIG. 6 is a block diagram illustrating a demonstrative processing system 600 implemented with embodiments of the invention. The illustrated embodiment of processing system 600 includes one or more processors (or central processing units) 605, system memory 610, NV memory 615, a data storage unit ("DSU") 620, a communication link 625, and a chipset 630. The illustrated processing system 600 may represent a computing system including a desktop computer, a notebook computer, a workstation, a handheld computer, a server, a blade server, a removable storage device, a peripheral device, or the like. NV memory 615 may represent the combination of variable reference voltage circuit 300 and NV memory array 305.

The elements of processing system 600 are interconnected as follows. Processor(s) 605 is communicatively coupled to system memory 610, NV memory 615, DSU 620, and communication link 625, via chipset 630 to send and to receive instructions or data thereto/therefrom. In one embodiment, NV memory 615 is a flash memory device (e.g., SONOS flash memory). In one embodiment, system memory 610 includes random access memory ("RAM"), such as dynamic RAM ("DRAM"), synchronous DRAM ("SDRAM"), double data rate SDRAM ("DDR SDRAM"), static RAM ("SRAM"), and the like. DSU 620 represents any storage device for software data, applications, and/or operating systems, but will most typically be a nonvolatile storage device. DSU 620 may optionally include one or more of an integrated drive electronic ("IDE") hard disk, an enhanced IDE ("EIDE") hard disk, a redundant array of independent disks ("RAID"), a small computer system interface ("SCSI") hard disk, and the like. Although DSU 620 is illustrated as internal to processing system 600, DSU 620 may be externally coupled to processing system 600. Communication link 625 may couple processing system 600 to a network such that processing system 600 may communicate over the network with one or more other computers. Communication link 625 may include a modem, an Ethernet card, a Gigabit Ethernet card, Universal Serial Bus ("USB") port, a wireless network interface card, a fiber optic interface, or the like.

It should be appreciated that various other elements of processing system 600 have been excluded from FIG. 6 and this discussion for the purpose of clarity. For example, processing system 600 may further include a graphics card, additional DSUs, other persistent data storage devices (e.g., tape drive), and the like. Chipset 630 may also include a system bus and various other data buses for interconnecting subcomponents, such as a memory controller hub and an input/output ("I/O") controller hub, as well as, data buses (e.g., peripheral component interconnect bus) for connecting peripheral devices to chipset 630. Moreover, processing system 600 may operate without one or more of the elements illustrated. For example, processing system 600 need not include DSU 620.

The processes described above may constitute machine-executable instructions embodied within a machine (e.g., computer) accessible medium, which when executed by a machine will cause the machine to perform the operations described herein. Additionally, the processes may be embodied within hardware, such as an application specific integrated circuit ("ASIC") or the like. A machine-accessible medium includes any mechanism that provides (i.e., stores) information in a form accessible by a machine (e.g., a computer, network device, personal digital assistant, manufacturing tool, any device with a set of one or more processors, etc.). For example, a machine-accessible medium includes recordable/non-recordable media (e.g., read only memory (ROM), random access memory (RAM), magnetic disk storage media, optical storage media, flash memory devices, etc.).

As described above, variable reference voltage circuit 300 and NV memory array 305 may be incorporated into various other systems and integrated circuits. Descriptions of variable reference voltage circuit 300 and/or NV memory array 305 may be generated and compiled for incorporation into these other systems and integrated circuits. For example, behavioral level code describing variable reference voltage circuit 300 and NV memory array 305, or portions thereof, may be generated using a hardware descriptive language, such as VHDL or Verilog, and stored to a machine-accessible medium. Furthermore, the behavioral level code can be compiled into register transfer level ("RTL") code, a netlist, or even a circuit layout and stored to a machine-accessible medium. The behavioral level code, the RTL code, the netlist, and the circuit layout all represent various levels of abstraction to describe variable reference voltage circuit 300 and NV memory array 305.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An apparatus, comprising:
   a multi-level voltage source to generate multiple voltages;
   a selector circuit including a selector input and a selector output, the selector input coupled to the multi-level voltage source to selectively couple any of the multiple voltages to the selector output;
   a non-volatile ("NV") memory array coupled to the selector output, the selector circuit coupled to provide the NV memory array with a selectable program voltage for programming the NV memory array and a selectable erase voltage for erasing the NV memory array;
   a first register coupled to store a multi-bit value for selecting a given memory operation type to perform on the NV memory array; and
   a second register coupled to store operation values for determining what voltage to select for the given memory operation type selected by the multi-bit value in the first register.

2. The apparatus of claim 1, wherein the multi-level voltage source includes a voltage divider coupled to divide a first voltage into the multiple voltages.

3. The apparatus of claim 1 wherein the NV memory array comprises a poly-silicon-oxide-nitride-oxide-silicon ("SONOS") type flash memory array.

4. The apparatus of claim 2, wherein the multi-level voltage source further includes:
   a reference voltage source to generate a reference voltage;
   an operational amplifier coupled in a follower with gain configuration to amplify the reference voltage and to generate the first voltage, the voltage divider coupled to an output of the operational amplifier.

5. The apparatus of claim 2, wherein the selector circuit comprises a plurality of switches coupled to the voltage divider at a plurality of nodes to tap off the multiple voltages and selectively couple any of the multiple voltages to the selector output.

6. The apparatus of claim 5, further comprising a controller coupled to control the plurality of switches within the selector circuit, wherein the controller comprises one of a microcontroller or a state machine.

7. The apparatus of claim 6, wherein the controller coupled to the first register to write the multi-bit value into the first register, the apparatus further comprising:

decoder logic coupled between the first register and control terminals of each of the plurality of switches, the decoder logic to decode the multi-bit value and configure the plurality of switches in response to the multi-bit value.

8. The apparatus of claim 7, wherein the second register is communicatively coupled to the decoder logic and storing at least one program value to indicate a program voltage to be applied to the NV memory array by the selector circuit during a program operation and at least one erase value to indicate an erase voltage to be applied to the NV memory array by the selector circuit during an erase operation.

9. The apparatus of claim 8, wherein the second register further stores:

a plurality of program values each indicating a corresponding plurality of program voltages to be applied to the NV memory array by the selector circuit during program operations, the plurality of program values optimized for a range of operating temperatures; and a plurality of erase values each indicating a corresponding plurality of erase voltages to be applied to the NV memory array by the selector circuit during erase operations, each of the plurality of erase values optimized for operating temperature range.

10. The apparatus of claim 8, wherein the second register further stores at least one read value to indicate a read voltage to be applied to the NV memory array by the selector circuit during a read operation.

11. A machine-accessible storage medium having contained thereon a description of an integrated circuit, the integrated circuit comprising:

a multi-level voltage source to generate multiple voltages;

a selector circuit including a selector input and a selector output, the selector input coupled to the multi-level voltage source to selectively couple any of the multiple voltages to the selector output;

a non-volatile ("NV") memory array coupled to the selector output, the selector circuit coupled to provide the NV memory array with a selectable program voltage for programming the NV memory array and a selectable erase voltage for erasing the NV memory array; and a register coupled to store a plurality of program values each indicating a different selectable program voltage to be applied to the NV memory array by the selector circuit at a given operating temperature range.

12. The machine-accessible storage medium of claim 11, wherein the selector circuit comprises a plurality of switches to tap off any of the multiple voltages and selectively couple any of the multiple voltages to the selector output, the integrated circuit further comprising:

a controller coupled to control the plurality of switches, wherein the controller comprises one of a microcontroller or a state machine.

13. The machine-accessible storage medium of claim 12, wherein the multi-level voltage source comprises:

a reference voltage source to generate a reference voltage;

an operational amplifier coupled to the reference voltage source in a follower with gain configuration to amplify the reference voltage and to generate the first voltage; and a voltage divider coupled to an output of the operational amplifier to divide the first voltage into the multiple voltages.

14. The machine-accessible storage medium of claim 12, wherein the register is further coupled to store an erase value to indicate an erase voltage to be applied to the NV memory array by the selector circuit under control of the controller during an erase operation.

* * * * *

UNITED STATES PATENT AND TRADEMARK OFFICE
CERTIFICATE OF CORRECTION

PATENT NO. : 7,586,795 B2  Page 1 of 1
APPLICATION NO. : 11/385235
DATED : September 8, 2009
INVENTOR(S) : Kutz et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 466 days.

Signed and Sealed this

Fourteenth Day of December, 2010

David J. Kappos
*Director of the United States Patent and Trademark Office*